United States Patent [19]
Chiles

[11] Patent Number: 5,228,045
[45] Date of Patent: Jul. 13, 1993

[54] TEST DRIVER FOR CONNECTING A STANDARD TEST PORT INTEGRATED CIRCUIT CHIP TO A CONTROLLING COMPUTER

[75] Inventor: Wilton R. Chiles, Poway, Calif.
[73] Assignee: NCR Corporation, Dayton, Ohio
[21] Appl. No.: 562,977
[22] Filed: Aug. 6, 1990
[51] Int. Cl.[5] ............................................. G06F 11/00
[52] U.S. Cl. .................................... 371/22.3; 371/15.1
[58] Field of Search .................. 371/22.3, 15.1, 25.1, 371/22.1; 364/717

[56] References Cited

U.S. PATENT DOCUMENTS

| | | | |
|---|---|---|---|
| 4,108,358 | 8/1978 | Niemaszyk et al. | 371/22.1 |
| 4,142,240 | 2/1979 | Ward et al. | 364/717 |
| 4,291,386 | 9/1981 | Bass | 364/717 |
| 4,348,597 | 9/1982 | Weber | 364/717 |
| 4,553,090 | 11/1985 | Hatano et al. | 371/22.3 |
| 4,566,104 | 1/1986 | Bradshaw et al. | 371/15 |
| 4,587,480 | 5/1986 | Zasid | 324/73 |
| 4,594,711 | 6/1986 | Thatte | 371/25 |
| 4,611,183 | 9/1986 | Piosenka et al. | 364/717 |
| 4,692,691 | 9/1987 | Sueta | 324/73 |
| 4,697,267 | 9/1987 | Wakai | 371/25 |
| 4,698,588 | 10/1987 | Hwang et al. | 324/73 |
| 4,698,830 | 10/1987 | Barzilai et al. | 377/29 |
| 4,703,484 | 10/1987 | Rolfe et al. | 371/25 |
| 4,713,605 | 12/1987 | Iyer et al. | 324/73 |
| 4,757,523 | 7/1988 | Tran | 377/29 |
| 4,780,627 | 10/1988 | Illman | 307/465 |
| 4,872,169 | 10/1989 | Whetsel, Jr. | 371/22.3 |
| 4,945,536 | 7/1990 | Hancu | 371/22.3 |
| 5,023,875 | 6/1991 | Lee et al. | 371/22.3 |
| 5,031,129 | 7/1991 | Powell et al. | 364/717 |
| 5,048,021 | 1/1991 | Jarwala et al. | 371/22.3 |

OTHER PUBLICATIONS

1989 IEEE, 1989 International Test Conference, "Tradeoff Decisions Made for a P1149.1 Controller Design" by Sue Vining, pp. 49–54.

Primary Examiner—Robert W. Beausoliel
Assistant Examiner—Phung M. Chung
Attorney, Agent, or Firm—Gregory P. Gadson

[57] ABSTRACT

A test driver for connecting a controlling computer to an IC chip having a standard test access port (TAP) is both hardware and software efficient. The last stage of a wrap-around or circulating control register feeds a test mode select (TMS) pin of the TAP, and feeds the next-to-the-last stage back to the first stage. As a result of the control register configuration, the control register's original contents are automatically restored after each shift, cycle, thus abrogating the need to reload the control register if the same control pattern is again needed, and abrogating the need to maintain (via software) the correct value on the TMS pin in between shifting sequences of the control register. Proper shift times in a data register of the test driver are achieved by replicating the IC chip TAP controller state machine.

14 Claims, 3 Drawing Sheets

TEST DRIVER FOR CONNECTING A STANDARD TEST PORT INTEGRATED CIRCUIT CHIP TO A CONTROLLING COMPUTER

FIELD OF THE INVENTION

The present invention generally relates to testing integrated circuit (IC) chips, and systems which incorporate IC chips. More specifically, the present invention relates to a test driver for connecting a computer to an IC chip having a standard test architecture and a standard communication protocol.

BACKGROUND OF THE INVENTION

Recent industry interest in standardizing the test architecture and protocol for all IC chips has resulted in the adoption (Feb. 15, 1990) by the Institute of Electrical and Electronics Engineers (IEEE) of Standard 1149.1-1990, entitled "IEEE Standard Test Access Port and Boundary Scan Architecture", which document is hereby expressly incorporated by reference. Each IC chip complying with this standard has a Test Access Port (TAP) and a Test Access Port Controller (TAPC). The standard precisely defines the manner in which communication between the IC chip via the TAP and a test driver takes place. Industry-wide adherence to the standard will allow for interchangeability of IC chips by different manufacturers, insofar as testing is concerned.

SUMMARY OF THE INVENTION

Accordingly, it is an object of the present invention to provide a test driver for communicating with a standard test port IC chip.

It is another object of the present invention to provide such a test driver in a configuration which is hardware efficient.

It is yet another object of the present invention to provide such a test driver in a configuration which enables software efficiency.

It is still a further object of the present invention to meet the above objects utilizing IC chips which comply with the aforementioned IEEE standard.

Broadly speaking, there is provided in accordance to the present invention, a test driver for connecting a controlling computer to an under-test integrated circuit (IC) chip having a standard test access port (TAP) with at least a test mode select (TMS) pin and a standard test access port controller (TAPC), the test driver including:

a data register connected to the controlling computer, and connected to test data input (TDI) and test data output (TDO) pins of the TAP, for input and output of test data, respectively, the test data initially received from the controlling computer; and a wrap-around control register connected to the controlling computer and at its rightmost stage to the TMS pin, for storing control information received from the controlling computer, the leftmost stage connected to a stage other than the rightmost stage for circulating the information with each shift, so that the previously loaded control information is restored after a shifting cycle is complete.

The present invention also provides a test driving method applicable in the above-mentioned environment, which method includes the steps of:

with the data register connected to the controlling computer, and connected to TDI and TDO pins of the TAP, inputting and outputting test data via the TDI and TDO pins, respectively, the test data initially received from the controlling computer;

storing control information received from the controlling computer in the wrap-around control register connected at its rightmost stage to the TMS pin, and connected at its leftmost stage to a stage other than the rightmost stage; and circulating the information with each shift, so that the previously loaded control information is restored after a shifting cycle is complete.

The details of the present invention will be revealed in the following description with reference to the attached drawings

DESCRIPTION OF THE PREFERRED EMBODIMENT

Figure 1:
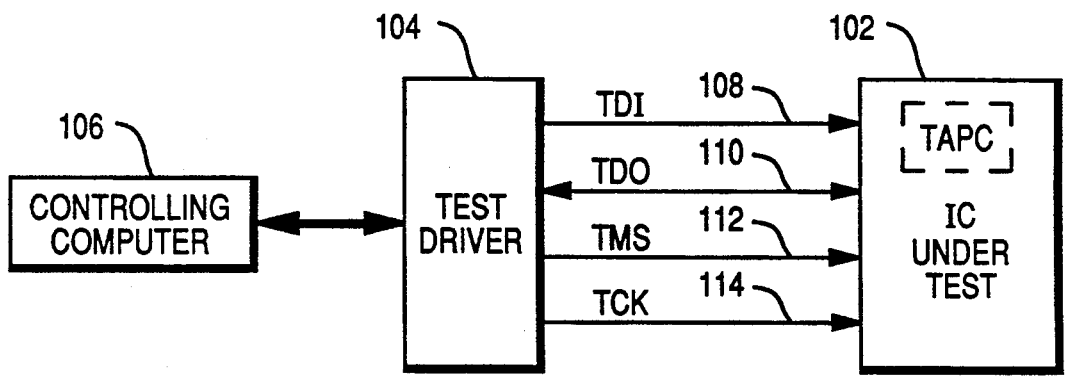
FIG. 1 is a schematic diagram of the test driver interfacing an IC chip under test and a controlling computer.

Since the invention resides primarily in the novel structure combination and the method of operation of well-known computer circuits and devices, and not in the specific detailed structure thereof, the structure, control, and arrangement of these well-known circuits and devices are illustrated in the drawings by use of readily understandable block representations and schematic diagrams, which show only the specific details pertinent to the present invention. This is done in order not to obscure the disclosure with structural details which will be readily apparent to those skilled in the art in view of the description herein. Also, various portions of these systems have been appropriately consolidated and simplified to stress those portions pertinent to the present invention.

In FIG. 1 an IC chip 102 adhering to the previously mentioned IEEE standard is connected to a test driver 104 via test access port (TAP) lines 108-114. The test driver 104 is also connected to a controlling computer 106. In accordance with the standard the IC chip 102 has a TAP controller (not shown, and its TAP consists of four pins identified as follows: test data in (TDI) 108; test data out (TDO) 110; test mode select (TMS) 112; and test clock (TCK) 114.

Figure 3:
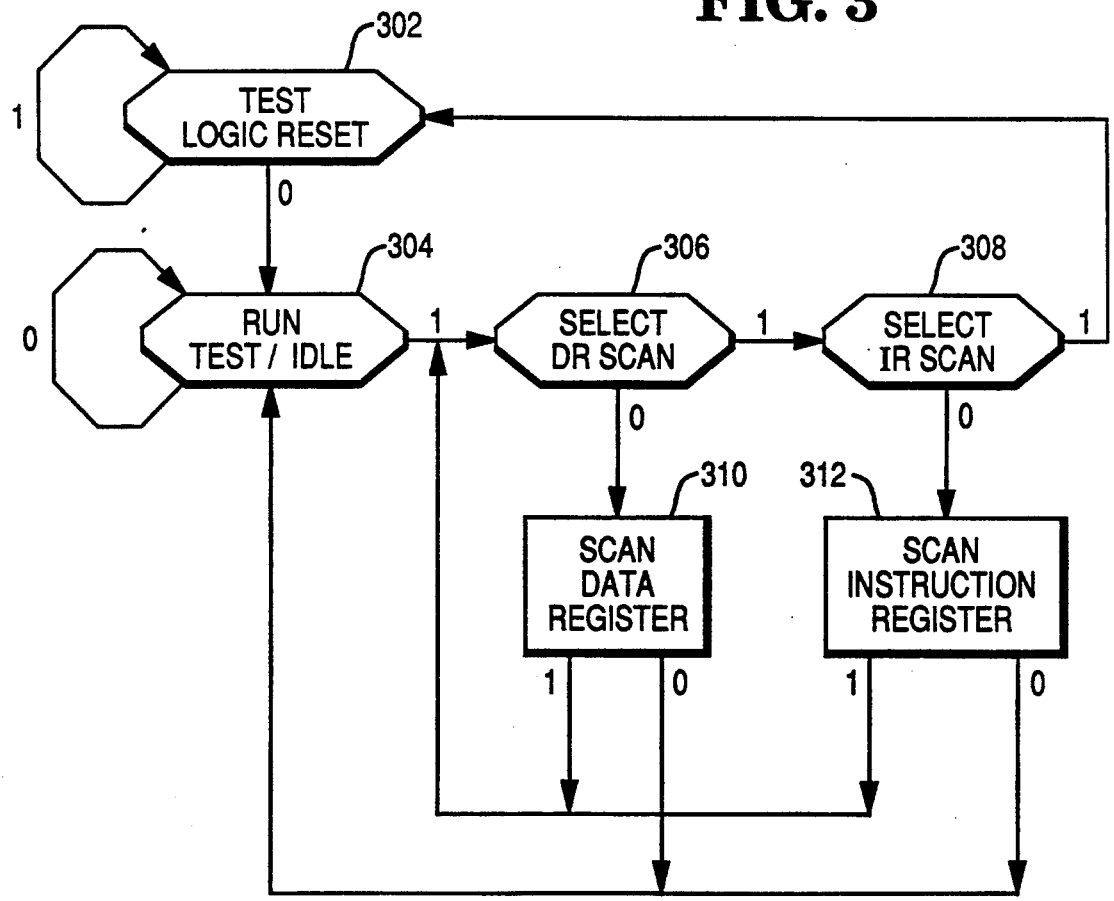
FIG. 3 is state diagram of the IC chip TAPC.
Figure 4:
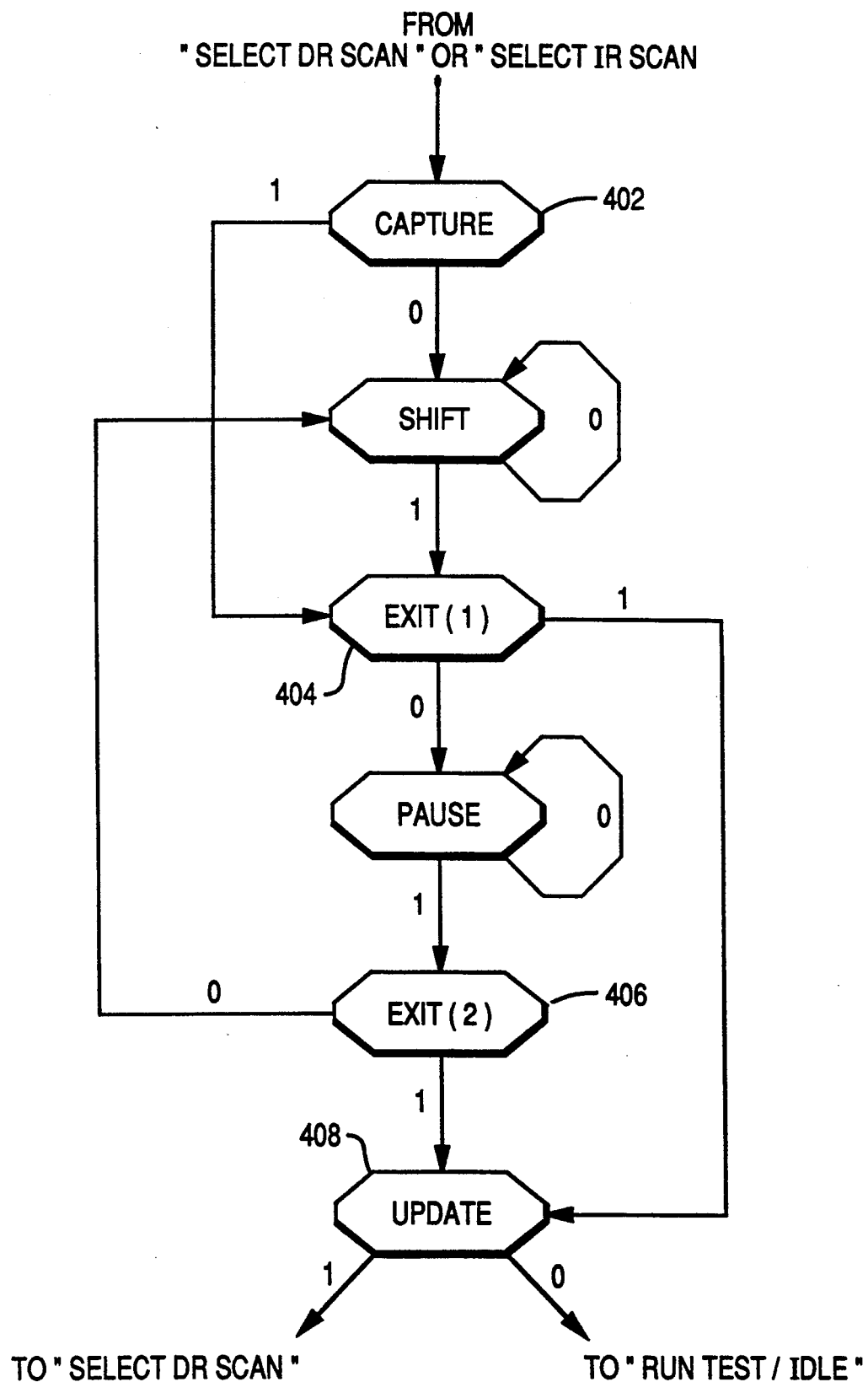
FIG. 4 is an expanded version of the "scan data register" portion of the state diagram in FIG. 3.

All communication between the IC chip 102 (via the TAP) and the test driver 104 is well-defined by the standard. The TDI and TDO pins receive and transmit the test data used during the actual testing of the IC chip 102. The TMS pin 112 receives a series of bits which determine the state of the TAPC. The state machine of the TAPC is shown in FIGS. 3 and 4, and will be explained infra. The description so far has pertained to the standard without regard to the specifics of the test driver of the present invention.

Figure 2:
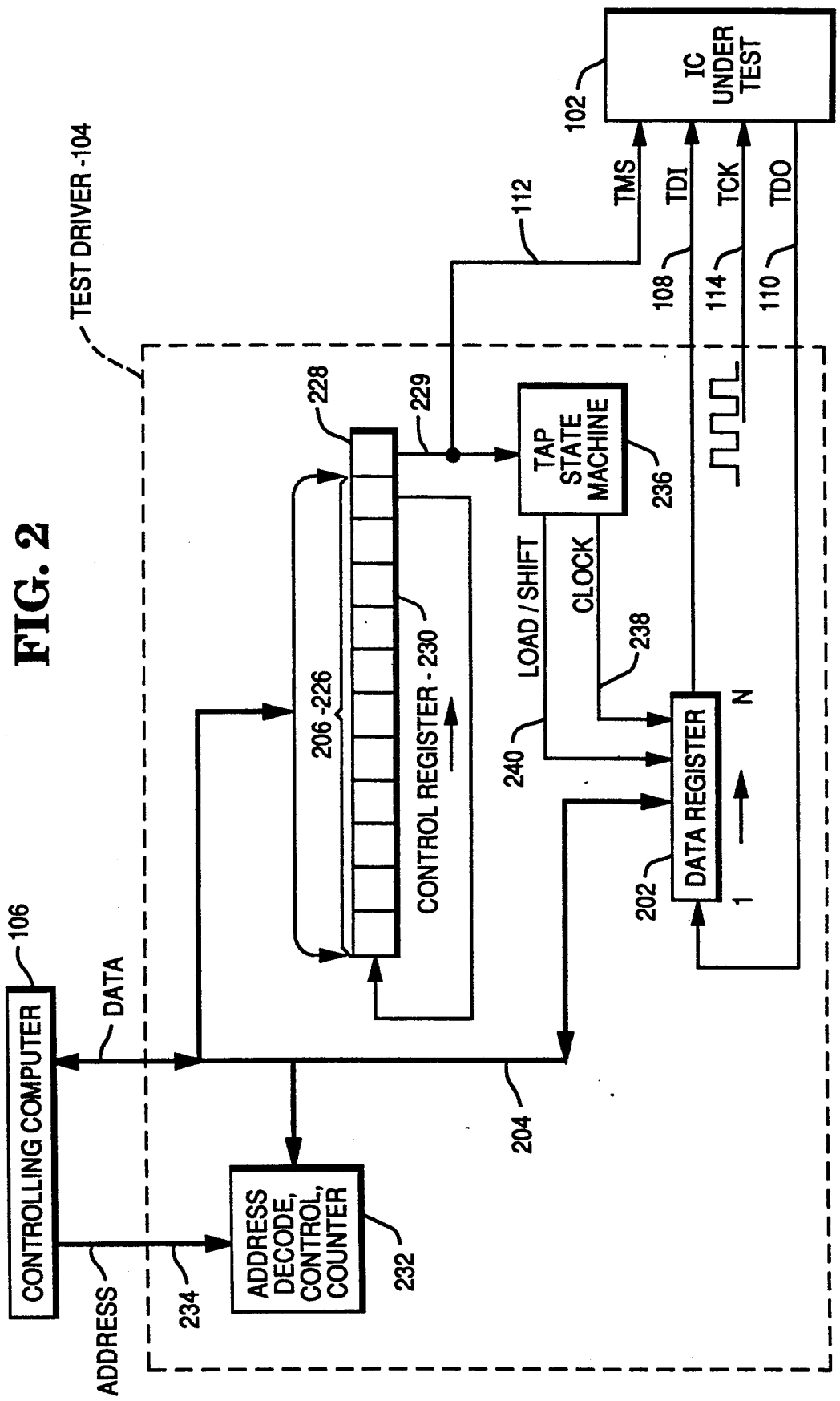
FIG. 2 is the schematic diagram in FIG. 1, with a detailed representation of the test driver.

Turning now to FIG. 2, all of the test data to be utilized by the IC chip 102 is introduced to a parallel-load shift or data register 202 via a bus 204 from the controlling computer 106. A "load" or "shift" signal is received by the data register 202 on line 240 to determine whether the data register 202 is to load data from the controlling computer 106, or shift and output the data to the TDI pin 108. A clock signal is received on line 238 to control the timing of the data register 202 operation. The data register 202 also receives data from the TAPC via the TDO pin, which data is available to be read by the controlling computer 106 via the bus 204.

Another parallel-load shift register 230 has stages 206-228, and serves as a control register. The control register 230 is loaded with a control word received by the controlling computer 106 via the bus 204. The last stage 228 of the control register 230 drives the TMS pin 112 via a line 229. In the preferred embodiment, the number of stages in the control register is three more than the number of stages in the data register 202. After each clock pulse, the word in the control register 230 is shifted one stage to the right in the figure.

A control counter 232 is of the countdown type, and is loaded with a number equal to the number of stages in the control registers minus one by the controlling computer 106 via line 234. After each clock pulse, the control counter sends a shift signal via bus 204 to the control register 230, causing the control register 230 to shift its contents to the right one stage, and decrements the number by one. When the control counter 106 reaches zero, it ceases to send a "shift" signal.

The operation of the test driver 104 is as follows. The TAPC is in a "pause" state following a previous control sequence. (Refer to the state diagram in FIGS. 3 and 4). A TAP state machine 236 in the test driver 104 mirrors the state machine in the TAPC in order to synchronize the operation of the data register 202 with the test operations in the IC chip 102. The TAP state machine 236 supplies a "load" signal via line 240 to the data register 202 which enables the controlling computer 106 to load the data register 202 with test data. Contemporaneously, the control register is parallel-loaded with a control word from the controlling computer 106. Also, the control counter 232 is loaded with the number equal to the stages in the control register.

The control counter 232 then sends a "shift" signal to the control register 230, causing it to shift its rightmost bit at stage 226 to stage 228, and also to feed the bit being shifted to the stage 228 from stage 226 back to the first stage 206. The TAPC and the TAP state machine 236 then advance according to the procedure shown in FIG. 4. At appropriate places in the state diagram, the data register 202 is shifted to circulate test data in the IC chip 102 under test. The TAPC and the TAP state machine 236 follow the control pattern introduced by the controlling computer 106. The control register 230 continues shifting and wrapping around until the original control word is restored, whereupon, the zero state of the control counter 232 causes the control register 230 to stop shifting.

The TAPC and the TAP state machine 236 are returned to the "pause" state, where they are maintained in that state by the bit in the control register stage 228. The controlling computer 106 can read data from or write data to the data register 202 during this time. Also, the controlling computer 106 can change the control word pattern stored in the control register 230 at this time. However, economy is obtained by not having to re-introduce the control word by the controlling computer 106 when the control word is to remain the same during the next sequence. This is because of the wrap-around nature of the control register 230.

As can be seen from the portion of the state machine in FIG. 4, the number of clock pulses required to shift all of the bits of the data stored in the data register 202 is equal to the number of stages in that register (one clock pulse corresponds to one shift) plus 3 clock pulses required to change the state machine from the "pause" state through the "exit(2)" and "shift" states, and then back to the "pause" state via the "exit(1)" state. Hence the number of stages in the control register 230 is N+3+1=N+4, where N is the number of the stages in the data register 202. The extra stage represents the stage 228, which is used to keep the TAPC and TAP state machine 236 in the "pause" between test data runs.

A brief description of the "states" in FIGS. 3 and 4 will now be given. In the "Test logic reset" state (block 302), the IC chip is operating normally, and test circuitry is essentially invisible to it. The "Run test/idle" (block 304) activates a built-in self-test, but only in IC chips with a special self-testing feature. "Select DR scan" (block 306) and "Select IR scan " (block 308) refer to selecting the data registers and instruction registers to scan, respectively. "Scan data register" (block 310) places the selected data register into the "shift" mode. "Scan instruction register" (block 312) determines, inter alia, which data registers will be used, and whether the testing will be external or internal.

In the "capture" state (block 402) the logical state of the IC chip pins under test are loaded into a boundary scan register. "Exit(1)" (block 404) and "Exit(2)∞ (block 406) are merely decision points in the state machine, and have no other function. The "Update" state (block 408) forces the IC chip into either the "Select DR scan" state of the "Run test/idle" state. The above description of the TAPC state machine and the TAP state machine 236 (recall that they are identical in the present invention) was brief, since the state machine is described in detail in the IEEE Standard 1149.1-1990.

Variations and modifications to the present invention are possible given the above disclosure. However, all such variations and modifications are intended to be within the scope of the invention claimed by this letters patent.

We claim:

1. A test driver for coupling a controlling computer to an under-test integrated circuit (IC) chip having a standard test access port (TAP) with at least a test mode select (TMS) pin and a standard test access port controller (TAPC), said test driver comprising:

a data register coupled to said controlling computer, and coupled to test data input (TDI) and test data output (TDO) pins of said TAP, said register receiving test data from said computer for transfer to said IC via said TDI pin and receiving data from said IC via said TDO pin for transfer to said computer; and a wrap-around control register, having a number of shift stages and connected between said controlling computer and said TMS pin, for storing control information received from said controlling computer, said control register having a first end stage coupled to said TMS pin and a second end stage on the end opposite said first end stage coupled to a stage other than said first end stage for circulating the information with each shift, so that the previously loaded control information is restored after a shifting cycle is complete.

2. The test driver in claim 1 further comprising a TAP state machine coupled to the first end stage of said control register and coupled to said data register to clock and place said data register in a shift mode when said TAP state machine is in a "shift" state.

3. The test driver in claim 2 further comprising a decrementing control counter coupled to said controlling computer and coupled to said control register, wherein said control counter is loaded with a number equal to the number of shift stages of said control register minus one, sends shift control signals to said control register causing said control register to shift, decrements after each shift until said control counter reaches zero, and then ceases to send shift control signals.

4. The test driver in claim 2 wherein said data register has a number of stages and wherein the number of stages in said control register is 4 more than the number of stages in said data register.

5. The test driver in claim 1 further comprising a decrementing control counter coupled to said controlling computer and coupled to said control register, wherein said control counter is loaded with a number equal to the number of shift stages of said control register minus one, sends shift control signals to said control register causing said control register to shift, decrements after each shift until said control counter reaches zero, and then ceases to send shift control signals.

6. The test driver in claim 5 wherein said data register has a number of stages and wherein the number of stages in said control register is 4 more than the number of stages in said data register.

7. The test driver in claim 1 wherein said data register has a number of stages and wherein the number of stages in said control register if 4 more than the number of stages in said data register.

8. A test driving method for coupling a controlling computer to an under-test integrated circuit (IC) chip having a standard test access port (TAP) with at least a test mode select (TMS) pin and a standard test access port controller (TAPC), said test driving method comprising the steps of:

with a data register coupled to said controlling computer, and coupled to test data input (TDI) and test data output (TDO) pins of said TAP, transferring test data from said register to said IC via said TDI pin and transferring data from said IC to said register via said TDO pin;

storing control information received from said controlling computer in a wrap-around control register, said control register having a number of shift stages and connected between said computer and said TMS pins, wherein a first end stage is coupled to said TMS pin, and a second end stage is coupled to a stage other than said first end stage; and circulating the information with each shift, so that the previously loaded control information is restored after a shifting cycle is complete.

9. The test driving method in claim 8 further comprising the step of clocking and placing said data register in a shift mode by a TAP state machine when said TAP state machine is in a "shift" mode, said TAP state machine coupled to the first end stage of said control register and coupled to said data register.

10. The test driving method in claim 9 further comprising the steps of:

loading a decrementing control counter coupled to said controlling computer and coupled to said control register with a number equal to the number of shift stages of said control register minus one;

sending shift control signals to said control register causing said control register to shift;

decrementing said control counter after each shift until said control counter reaches zero; and ceasing to send shift control signals when said control counter reaches zero.

11. The test driving method in claim 9 wherein said data register has a number of stages and wherein the number of stages in said control register is 4 more than the number of stages in said data register.

12. The test driving method in claim 8 further comprising the steps of:

loading a decrementing control counter coupled to said controlling computer and coupled to said control register with a number equal to the number of shift stages of said control register minus one;

sending shift control signals to said control register causing said control register to shift;

decrementing said control counter after each shift until said control counter reaches zero; and ceasing to send shift control signals when said control counter reaches zero.

13. The test driving method in claim 12 wherein said data register has a number of stages and wherein the number of stages in said control register is 4 more than the number of stages in said data register.

14. The test driving method in claim 8 wherein said data register has a number of stages and wherein the number of stages in said control register is 4 more than the number of stages in said data register.

* * * * *